(12) United States Patent
Proell et al.

(10) Patent No.: US 7,710,810 B2
(45) Date of Patent: May 4, 2010

(54) DEVICE FOR REFRESHING MEMORY CONTENTS

(75) Inventors: Manfred Proell, Dorfen (DE); Stephan Schroeder, Munich (DE)

(73) Assignee: Qimonda AG, Munich (DE)

( * ) Notice: Subject to any disclaimer, the term of this patent is extended or adjusted under 35 U.S.C. 154(b) by 316 days.

(21) Appl. No.: 11/844,047

(22) Filed: Aug. 23, 2007

(65) Prior Publication Data

US 2008/0056045 A1    Mar. 6, 2008

(30) Foreign Application Priority Data

Aug. 29, 2006   (DE) ................ 10 2006 040 399

(51) Int. Cl.
*G11C 7/00*   (2006.01)
(52) U.S. Cl. ...................... 365/222; 365/203
(58) Field of Classification Search ............. 365/222, 365/203
See application file for complete search history.

(56) References Cited

U.S. PATENT DOCUMENTS

| | | | |
|---|---|---|---|
| 6,762,958 B2 * | 7/2004 | Schramm et al. ....... | 365/189.07 |
| 6,778,455 B2 * | 8/2004 | Bell ........................... | 365/222 |
| 6,845,051 B2 * | 1/2005 | Komura ..................... | 365/203 |
| 6,937,535 B2 | 8/2005 | Ahn et al. | |
| 2006/0087902 A1 | 4/2006 | Hoehler | |

FOREIGN PATENT DOCUMENTS

DE    103 50 339 A1    6/2004

* cited by examiner

*Primary Examiner*—Anh Phung
*Assistant Examiner*—Hien N Nguyen
(74) *Attorney, Agent, or Firm*—Slater & Matsil, L.L.P.

(57) ABSTRACT

A device can be used for refreshing memory contents of first and second memory cells. The memory contents of the first memory cells are refreshed in a first period of time and the memory contents of the second memory cells are refreshed in a second period of time. A pre-charge circuit is provided for bit lines for the first memory cells and the second memory cells. A controller may be coupled to the pre-charge circuit to control the pre-charge circuit such that a pre-charge voltage may be applied to the bit lines of the first memory cells during the first period of time and not during the second period of time and that the pre-charge voltage may be applied to the bit lines of the second memory cells during the second period of time and not during the first period of time.

27 Claims, 3 Drawing Sheets

DEVICE FOR REFRESHING MEMORY CONTENTS

This application claims priority from German Patent Application No. 10 2006 040 399.1, which was filed on Aug. 29, 2006, and is incorporated herein by reference in its entirety.

TECHNICAL FIELD

In one embodiment, the present invention relates to a device and a method for refreshing memory contents of memory cells.

BACKGROUND

A DRAM memory is a random address volatile memory type the memory cells of which lose their contents within a certain period of time even when applying a supply voltage and therefore necessitates refreshing or renewal of the memory contents at fixed intervals. A basic principle of dynamic memory is realizing individual memory cells by transistors and capacitor elements using highly integrated circuits based on silicon. Every memory cell represents an individual bit in the form of a logic zero or one. Due to a small number of elements per memory cell, the DRAM technology is most suitable to achieve high memory capacity on little space. A disadvantage of the dynamic RAM is that a piece of information stored in the cells only persists for a very short time and has to be refreshed continuously by relatively complicated mechanisms.

Memory cells of dynamic memory elements are realized as memory capacitances by separating two well-conducting layers of the largest area possible by a high-resistance dielectric as thin as possible. In a technological realization of these minimal structures, a plurality of high-resistance leakage current paths to the surroundings of a cell or via the dielectric of the memory cell itself cannot be avoided. The high-resistance leakage current paths which are strongly dependent on temperature may result in a discharge of the charge stored in a memory capacitance of a memory cell and thus result in a data loss of the memory cell. In order to be able to reliably read out the memory cell with correct data contents, a residual charge in the memory cell must not fall below a predetermined level. The data contents of the memory cells and/or a sufficient cell residual charge can be guaranteed when refreshing, that is recharging, the memory cell within a defined time. A time interval between two successive refreshes of a memory cell while still being able to read out the cell information correctly, is referred to as retention time.

A memory field and/or a memory matrix of DRAMs includes rows (word lines) and columns (bit lines). When a memory is accessed, a word line is generally enabled at first. Thus, the memory cells arranged in a row are each connected to a bit line in a conducting manner. The charge of a cell is divided into cell and bit line capacitance. Corresponding to the ratio of the two capacitances (transfer ratio), this results in a deflection of a bit line voltage. A primary sense amplifier (SA) which exemplarily compares and subsequently amplifies this bit line voltage to a constant voltage on a reference bit line is arranged at the end of the bit line.

DRAM memory elements may be placed in different operating modes and can be operated correspondingly. A so-called self-refresh mode of DRAM memory elements is, for example, employed to save current, in particular in laptop applications. When an application is in a standby mode, DRAM memory modules can be placed in a sleep mode where the memory element itself provides for maintaining the charge of its data, instead of the application. Thus, the application does not have to communicate additional commands or addresses to the memory element. Charge retention is ensured by chip-internal refresh commands. Suitable intervals between the refresh commands guarantee a sufficient charge in the memory cells which can result in a correct evaluation of the cell contents. If the intervals between the internal refresh commands are selected to be too short, the danger of data loss will decrease, however the current consumption during the current-saving mode will increase. If, however, the time intervals between the refresh commands are selected to be too great in order to achieve a low operating current, the risk of data loss in the self-refresh mode will increase correspondingly.

SUMMARY OF THE INVENTION

An embodiment of the present invention relates to a device for refreshing memory contents of first and second memory cells, wherein the memory contents of the first memory cells are refreshed in a first period of time and the memory contents of the second memory cells are refreshed in a second period of time, comprising a pre-charge circuit for bit lines for the first memory cells and the second memory cells, and a controller which may be coupled to the pre-charge circuit to control the pre-charge circuit such that a pre-charge voltage may be applied to the bit lines of the first memory cells during the first period of time and not during the second period of time and the pre-charge voltage may be applied to the bit lines of the second memory cells during the second period of time and not during the first period of time.

Thus, embodiments of the present invention are advantageous in that current can be saved by maintaining the pre-charge voltage of the bit lines of memory cells of a memory segment only in a period of time of refreshing the memory contents of the memory segment. An accumulator lifetime in applications on mobile apparatuses may, for example, be increased by this.

BRIEF DESCRIPTION OF THE DRAWINGS

Embodiments of the present invention will be detailed subsequently referring to the appended drawings, in which.

DETAILED DESCRIPTION OF ILLUSTRATIVE EMBODIMENTS

Figure 1:
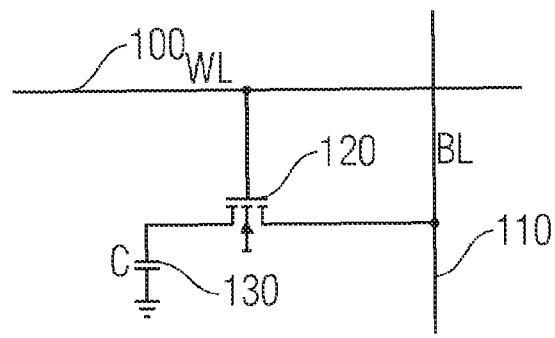
FIG. 1 is a basic circuit diagram of a conventional DRAM memory cell.

With reference to the following description, it is to be kept in mind that same functional elements or functional elements having the same effect are given same reference numerals in the different embodiments and that the description of these functional elements in the different embodiments illustrated below are mutually interchangeable.

Subsequently, the term "signal" is used for both currents and voltages alike, except where something different is indicated explicitly.

FIG. 1 shows the basic setup of an individual conventional DRAM memory cell. The DRAM memory cell includes a word line 100, a bit line 110, a transistor 120 and a capacitor 130.

The individual DRAM memory cell has a simple setup. A gate terminal of the transistor 120 is coupled to the word line 100, a drain terminal to the bit line 110. A first terminal of the memory capacitor 130 is connected to a source terminal of the transistor 120. A second terminal of the memory capacitor 130 is, for example, at a ground potential.

The state of the memory cell and thus the digital information contained is determined by the charge stored in the capacitor 130. A switch in the form of the transistor 120 drives the cell. It can isolate the charge in the capacitor 130 or switch same through for reading in and out a datum. The gate terminal of the transistor 120 is connected to the word line 100 for this. If a level of the word line 100 is "low", the transistor 120 will be in a high-resistance state. The charge of the capacitor 130 is isolated and thus remains stored. For writing or reading the DRAM memory cell shown in FIG. 1, the signal level of the word line 100 is increased to "high". The transistor 120 thus is conductive and connects the capacitor 130 to the bit line 110. When writing, the charge of the capacitor 130 will correspondingly match the level of the bit line 110 on which the information to be written, that is "0" or "1", is. When reading, expressed in a simplified manner, the bit line 110 is increased to a level of the capacitor 130. Since charges of the memory capacitors 130 are typically very low, generally some additional electrical measures are necessary to achieve defined signals.

Unit memory cells, as shown in FIG. 1, consisting of a transistor 120 and a capacitor 130 are arranged in DRAM-ICs (integrated circuits) in a matrix of rows and columns. In this matrix, every individual memory cell can be addressed unambiguously via the respective row and column numbers. Addressing the memory typically takes place in two steps, by transferring the addresses for the row and column to the DRAM chip in temporal succession. Two control signals RAS (row access strobe) and CAS (column access strobe) control multiplexing of row and column addresses. They indicate to the DRAM chip whether an address signal applied by a memory controller is dedicated for controlling a row or column. If the control signal RAS responsible for row addressing is enabled, the address applying will be read into an address buffer of the DRAM and passed on to an internal row decoder and decoded. After a defined delay, an address input of the DRAM chip will receive the column address. Due to the CAS signal now enabled, the DRAM can recognize that this is a column address. The address buffer will read in the address and pass it on, this time to a column decoder.

A memory cell which is then defined unambiguously can transfer its datum via the bit line 110 to a sense amplifier. After amplifying the information read out, it will be available via an output buffer at a so-called DQ pin of the DRAM chip. In conventional SDRAM (synchronous DRAM) chips, commands like ACT (enabling the word line and/or the row address) and WR (write on the selected bit line and/or column address) and RD (read on the selected bit line and/or column address) are realized by different combinations of the control signals RAS and CAS.

When writing the memory cell, another write signal will be enabled by a memory controller. The DRAM will read the data applied to the DQ pin into a data input buffer. The sense amplifier will process the datum and provide it to the memory cell addressed.

As has been described before, DRAM memory elements can be placed in the self-refresh mode to save current. In the self-refresh mode, the DRAM memory element itself determines a duration of time intervals between refresh cycles, and those memory cells the contents of which is to be refreshed. A refresh cycle includes enabling a word line in a memory cell field or matrix. The cell information from the memory cells driven by the word line is placed on the corresponding bit lines and evaluated by sense amplifiers coupled to the bit lines and increased to a full bit line level. After that, this signal is written back to the memory cell via the opened cell transistor 120. After a short time, the word line 100 will shut the selection transistor 120 and thus separate the bit line 110 and the memory cell. The bit line will then be pre-charged to a bit line center potential and is ready for a next refresh cycle.

The memory matrix and/or memory bank of the DRAM element may internally be composed of several parallel memory fields or memory segments, depending on the IC type. Typically, word lines including memory cells to be refreshed are addressed in parallel in all memory banks and controlled by a ring counter triggered via a time element such that the least significant word line address can be accessed again in the subsequent cycle after refreshing a highest word line address.

Figure 2:
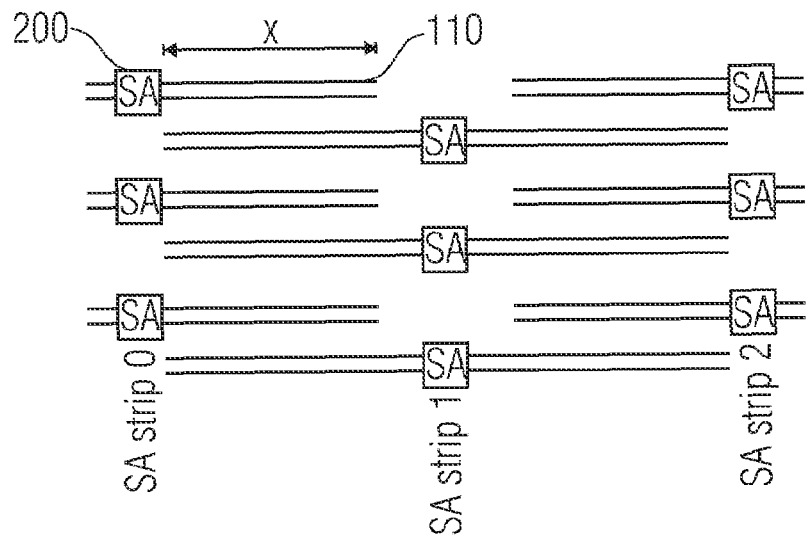
FIG. 2 is a schematic illustration of a conventional DRAM memory bank.

FIG. 2 shows a schematic illustration of a conventional memory bank. A memory bank comprises a plurality of sense amplifiers 200 which are coupled to a plurality of bit lines 110.

A memory bank, in the word line direction (x-direction), is divided into several segments which are determined by the corresponding bit line length. Thus, there are, for example, x=512 to x=1,024 word lines at a physical bit line of a memory segment. Every bit line 110 of a memory segment has its own sense amplifier 200 or a sense amplifier 200 shared with a bit line of the neighboring segment.

SDRAM elements usually found on the market at present have a capacitance of 256 Mbits and comprise a different number of DQ pins and a different number of memory banks. Typically, a memory segment of a memory bank of a 256-Mbit SDRAM element has a size of 4 Mbits. When linearly addressing the word lines in the self-refresh mode, a predominant number of the memory segments will be in a pre-charge state, depending on how many segments per refresh are enabled at the same time. Typically, two segments per memory bank are enabled at the same time. Thus, the bit line center voltage is maintained in all pre-charged memory segments. This can compensate charge losses on the bit line into the substrate (bit line contacts), to word lines (CBGC leakage path), to repaired neighboring lines or charge losses via sense amplifier transistors. Charge losses of the bit line system of a memory segment have the effect of a current in the bit line voltage network when the bit line center voltage is to be maintained.

Without maintaining the bit line center voltage, the potential on the bit lines will settle at a potential at another end of the leakage path and thus usually exhibit a lower potential than the bit line center voltage. This will be uncritical for the cell charge stored as long as the cells are not evaluated in this state of the bit line. In order to evaluate the bit line, that is at the time of refresh of certain memory cells within a memory segment, a bit line must have the correct bit line center potential.

From the point of view of an individual memory segment, a memory chip in the self-refresh mode, however, is almost always busy refreshing word lines in other memory segments. Thus, for an individual memory segment, maintaining the bit line center voltage is really necessary for only a short time, namely the time of refresh of the memory segment. In the time when other memory segments are refreshed, current can be saved according to the inventive procedure by switching off the bit line center voltage in memory segments not to be refreshed at that time.

However, this will only work if the point in time of an access to a certain memory segment is predictable. This will not be the case in normal operation (random access) of the memory element. By means of a ring counter and the linear addressing of the word line addresses in the self-refresh mode connected thereto, the point in time for the refresh of a segment by the chip itself can be defined precisely. Thus, the bit line center level necessary for a correct sense amplifier operation can be set shortly before the refresh access to a memory segment.

Figure 3:
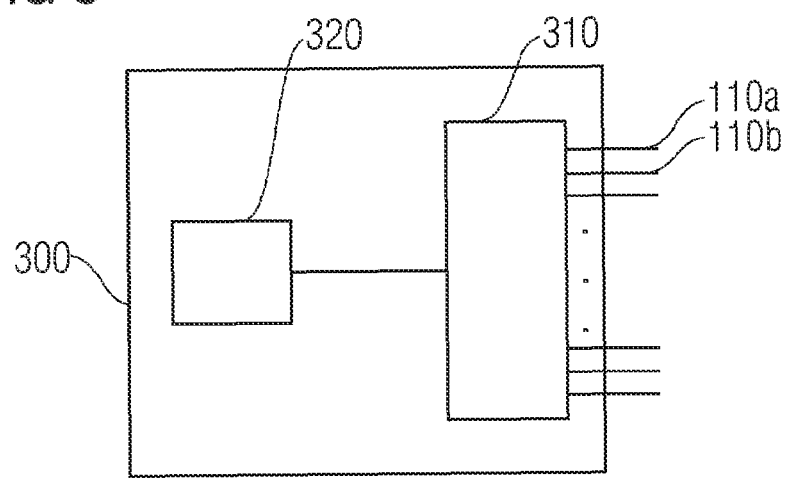
FIG. 3 is a schematic illustration of a device for refreshing memory contents according to an embodiment of the present invention.

FIG. 3 shows a device 300 for refreshing memory contents according to an embodiment of the present invention.

The device 300 comprises a pre-charge circuit 310 for bit lines of which, for reasons of clarity, only two are identified by reference numerals 110a and 110b. The pre-charge circuit 310 is additionally coupled to a controller 320.

The device 300 serves for refreshing memory contents of first and second memory cells in a first and a second memory segment, respectively, wherein the memory contents of the first memory cells are refreshed in a first period of time and the memory contents of the second memory cells are refreshed in a second period of time. Reliable readout of memory cells by extremely small capacitor capacitances of only a few fF (femtofarad, femto=$10^{-15}$) can be ensured only by additional electrical measures. As has already been described referring to FIG. 1, the gate of the memory cell transistor 120 is connected to the word line 100 to enable the memory cell. The bit line 110 reads out the contents of the capacitor 130 via the transistor 120 switched through. In DRAM-ICs, typically there is not only one bit line per column, but a bit line pair 110a, 110b. The memory cells are alternatingly connected to one of the two lines 110a, 110b.

Before beginning a refresh cycle of the first memory segment with the first memory cells, all the bit line pairs at the word lines of the first memory segment are exemplarily pre-charged to half the supply voltage VCC/2. This process is performed by the pre-charge circuit 310. An internal control signal EQL (equalize) shorts the bit line pairs 110a, 110b and thus charges the same to exactly the same voltage level VCC/2. This process is illustrated using the basic circuit diagram of FIG. 4.

Figure 4:
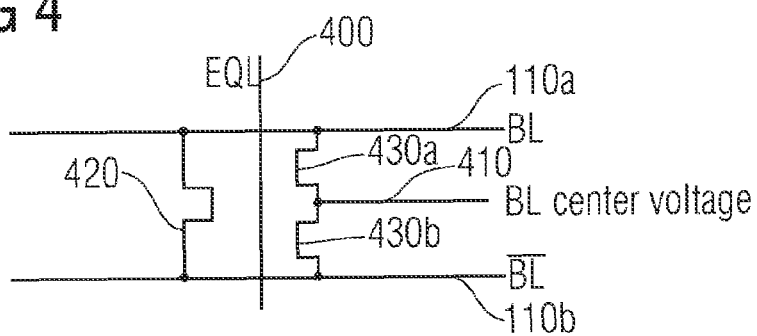
FIG. 4 is a flow chart for illustrating a method for refreshing memory contents according to an embodiment of the present invention.

FIG. 4 shows a bit line pair 110a and 110b, a first control line 400, a second control line 410, and a first transistor 420 and a transistor pair 430a, 430b. The first control signal line 400 is connected to control terminals of both the first transistor 420 and the transistors 430a, 430b, the second control signal line 410 is coupled to the drain terminals of the transistors 430a and 430b.

The control signal EQL across the first control line 400 enables the pre-charge circuit schematically shown in FIG. 4. If the control signal EQL is applied to the control terminal of the first transistor 420, its resistance will become low and it will short the two bit lines 110a and 110b of the bit line pair. Since the control signal EQL is also connected to the control terminals of the two transistors 430a and 430b, when applying EQL, the resistances of these two transistors will also become low and a bit line center potential applied to the second control line 410 is applied via the two transistors 430a, 430b to the bit line halves 110a and 110b. A geometry of the transistors 430a, 430b shown at the right and a quantity of the control signal EQL (overdrive) define, apart from a bit line capacitance, a lead time necessary for the refresh of a first word line of a memory segment. This time necessary for the charge process is typically referred to as RAS pre-charge time.

The actual refresh access can only start after this RAS pre-charge time. When applying a row address, the corresponding word line will be enabled. The fact that this is a row address is communicated to the DRAM element by the RAS signal described before. The transistors 120 of the memory cells of this row switch through and the memory capacitor charges flow to a respective first bit line of the bit line pairs 110a, 110b pre-charged to VCC/2. In a charged capacitor 130 (physical 1 stored), the potential of the first bit line is increased slightly. A discharged capacitor (physical 0 stored) slightly reduces the potential of the bit line by the charge process. The second line of the bit line pair 110a, 110b maintains its pre-charged potential VCC/2. In the case of an auto-refresh command (CBR command, CBR=CAS before RAS), however, no row address has to be applied. Instead, the DRAM memory uses a next row or word line address noted by a ring memory and/or ring counter.

A sense amplifier circuit exemplarily enabled by the controller 320 (not shown) amplifies the potential difference of the bit line pair 110a, 110b. At an increased potential of the first bit line, it will increase the same exemplarily to the supply voltage VCC, at a reduced potential, it will, for example, pull the same to ground. The second line of the bit line pair is forced to the opposite potential. This process refreshes the contents of the memory cells. After terminating a row refresh, the RAS pre-charge time has to be kept to, also with a directly subsequent refresh access. In this time, the bit lines are pre-charged by the pre-charge circuit 310 to half the supply voltage VCC/2.

The controller 320 increments the row addresses continuously after each refresh access by a ring counter until all the rows of a segment have been passed to then start refreshing a new memory segment.

Figure 5:
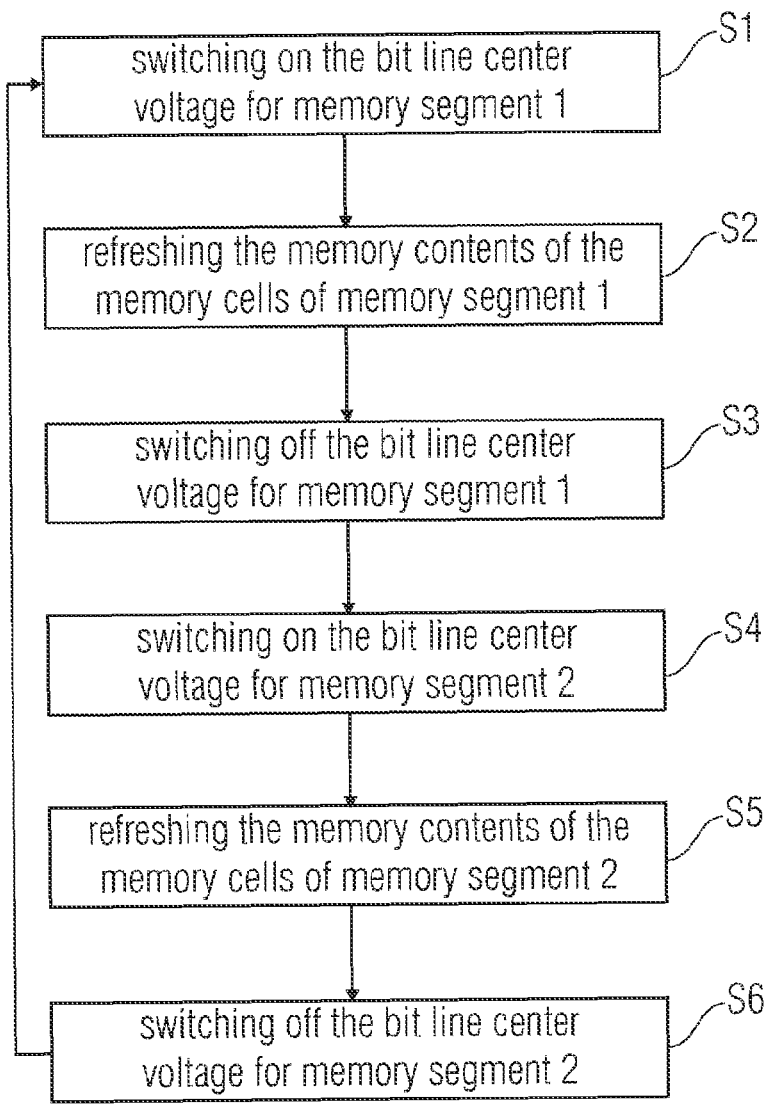
FIG. 5 is a schematic illustration of different phases of a self-refresh of a DRAM memory segment according to an embodiment of the present invention.

For a more detailed description of the procedure already described before, FIG. 5 schematically shows a flow chart of steps S1-S6 for realizing a method for refreshing memory contents of memory cells according to an embodiment of the present invention.

In a first step S1, for a first memory segment, the bit line center voltage is applied to the bit line pairs of the first memory segment by the controller 320. In a second step S2, the refresh of the memory contents of the memory cells of the first memory segment is performed according to the procedure described before. In addition, in a third step S3, the bit line center voltage is switched off for the bit line pairs of the first memory segment to subsequently switch on, in a fourth step S4, the bit line center voltage for bit line pairs of a second memory segment. Subsequently, in a fifth step S5, the memory contents of the memory cells of the second memory segment can be refreshed. Finally, after the refresh of the memory contents, in a sixth step S6, the bit line center voltage for the bit lines of the second memory segment can be switched off again as well. If a DRAM memory element only consists of the first and the second memory segment, step S1 will again follow step S6. Otherwise, a refresh process of a third memory segment will of course follow the refresh process of the second memory segment, etc.

For a more detailed discussion of the procedure described before referring to FIG. 5, FIG. 6 shows different phases of a self-refresh, as seen by a memory segment. A voltage V at the bit line pair 110a, 110b is plotted against time t.

In the phase marked by a reference numeral 610, the bit line center voltage is switched off. Thus, charges can dissipate from a bit line via leakage paths and the bit line level will decrease correspondingly. If the ring counter of the controller 320 in the self-refresh mode reaches a memory segment boundary, in the second phase marked by a reference numeral 620, the bit line center voltage of the memory segment to be refreshed soon is switched on again. The lead time necessary and/or the pre-charge time thus basically depends on a bit line capacitance and a transistor channel resistance in the on state of the supply transistors for the bit line center voltage, as has already been described referring to FIG. 4. In a third phase marked by a reference numeral 630, the memory cells connected to word lines in the memory segment to be refreshed are refreshed. Between subsequent refreshes in the memory segment, a bit line is pre-charged to the bit line center voltage VCC/2 regularly by driving the EQL signal in preparation for the next refresh in the memory segment. An additional extension of a current-saving phase can be achieved according to an embodiment of the present invention when the memory cells of a segment connected to word lines are refreshed in quick succession so that, during the pause gained to the refresh of a next memory segment, the memory segment just refreshed can already be separated from the bit line center voltage. A fourth phase marked by a reference numeral 640 corresponds to the first phase and applies for a duration in which the other segments of a memory bank are refreshed.

Figure 6:
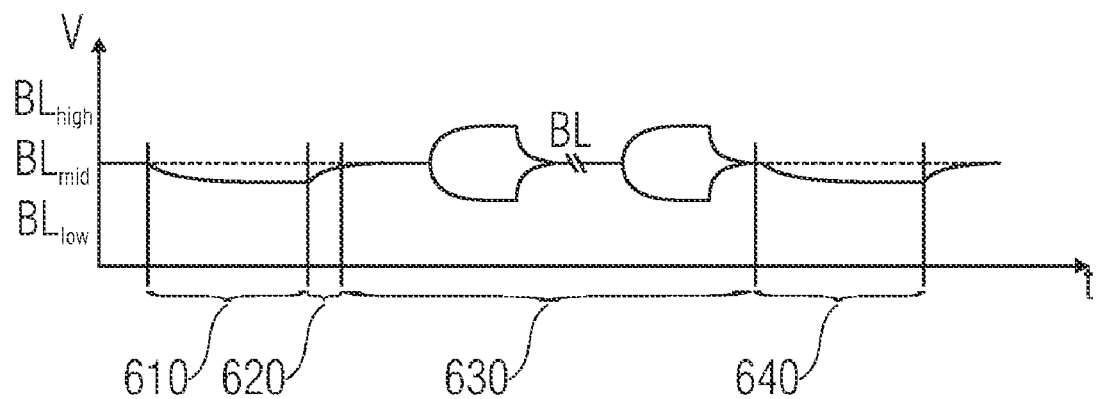
FIG. 6 is an equivalent circuit diagram of an ohmic leakage path.

It is to be mentioned here that the phases 610-640 in FIG. 6 are not represented in correct temporal scale. The first phase 610 and/or the fourth phase 640 is/are longer by a multiple than the third phase 630. The length of the first phase 610 and/or the fourth phase 640 is proportional to the number of segments per memory bank, whereas the third phase 630 is proportional to the bit line length and/or the number of word lines of a memory segment.

Figure 7:
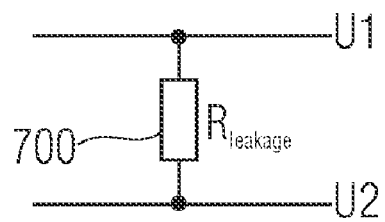
FIG. 7 is a schematic illustration of a circuit for applying a bit line center voltage according to an embodiment of the present invention.

Compared to continuously maintaining the bit line center voltage, energy can be saved by switching the same off in the phases 610 and 640, which can be exemplified using an example of an ohmic leakage path, as is illustrate in FIG. 7.

FIG. 7 shows an ohmic resistor 700 of a resistance $R_{Leakage}$ connected between a first voltage U1 and a second voltage U2.

For a duration T of the switched-off voltage U1, the result is an energy stored equaling:

$$W=(U1-U2)^2/R_{Leakage} \cdot T.$$

If a bit line center voltage is not maintained for the duration T, charge losses on the bit line to the substrate, to word lines, to neighboring lines repaired or via sense amplifier transistors will not be compensated in the time T and a current consumption in the refresh mode can be reduced by the inventive procedure.

In summary, embodiments of the present invention provide a method for refreshing memory contents of first and second memory cells, wherein the memory contents of the first memory cells are refreshed in a first period of time and the memory contents of the second memory cells are refreshed in a second period of time, comprising a step of applying a pre-charge voltage to a bit line of the first memory cells during the first period of time and not during the second periods of time and applying the pre-charge voltage to the second memory cells during the second period of time and not during the first period of time.

According to the inventive method, the controller 320 performs sequencing for refreshing a DRAM element. The controller 320, may according to an embodiment of the present invention, be on a main board or may, according to another embodiment of the present invention, be implemented in a DRAM element.

In particular, it is to be pointed out that depending on the circumstances, the inventive scheme may also be implemented in software. The implementation may be on a digital storage medium, in particular on a disc or a CD having control signals which may be read out electronically which can cooperate with a programmable computer system and/or microcontroller such that the corresponding method will be executed. In general, the invention thus also is in a computer program product having a program code stored on a machine-readable carrier for performing the inventive method when the computer program product runs on a computer and/or microcontroller. Put differently, the invention may also be realized as a computer program having a program code for performing the method when the computer program runs on a computer and/or microcontroller.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A device for refreshing memory contents of first and second memory cells, wherein the memory contents of the first memory cells are refreshed in a first period of time and the memory contents of the second memory cells are refreshed in a second period of time, the device comprising:
   a pre-charge circuit for bit lines for the first memory cells and the second memory cells; and
   a controller coupled to the pre-charge circuit to control the pre-charge circuit such that a pre-charge voltage may be applied to the bit lines of the first memory cells during the first period of time and not during the second period of time and that the pre-charge voltage may be applied to the bit lines of the second memory cells during the second period of time and not during the first period of time.

2. The device according to claim 1, wherein the first memory cells and the second memory cells comprise DRAM cells.

3. The device according to claim 1, wherein the controller comprises a ring counter and wherein the first and second memory cells are addressed by the ring counter.

4. The device according to claim 3, wherein the first memory cells are in a first memory segment and the second memory cells are in a second memory segment and the controller can control the pre-charge circuit such that, when the ring counter reaches a segment boundary between the first and second memory segment, the pre-charge voltage of the bit lines of the first memory segment is switched off and the pre-charge voltage is switched on for the bit lines of the second memory segment.

5. The device according to claim 1, wherein the controller is able to control the pre-charge circuit such that the pre-charge voltage is switched on with a defined lead time before the period of time of refreshing the memory contents of a memory segment to be refreshed.

6. The device according to claim 5, wherein the lead time is dependent on a bit line capacitance and a transistor channel resistance in an on state of a supply transistor for the pre-charge voltage.

7. The device according to claim 1, wherein the device refreshes the memory contents of the first and second memory cells in a self-refresh mode of a memory element on which the first and second memory cells are arranged.

8. The device according to claim 1, wherein the device is at least partly attached to a memory element.

9. A device for refreshing memory contents of memory cells from a first DRAM memory segment and a second DRAM memory segment of a DRAM memory bank, wherein the memory contents of the memory cells of the first DRAM memory segment are refreshed in a first period of time and the memory contents of the memory cells of the second DRAM memory segment are refreshed in a second period of time, the device comprising:

a pre-charge circuit for bit line pairs for the memory cells of the first DRAM memory segment and the memory cells of the second DRAM memory segment; and a controller comprising a ring counter for addressing word lines of the memory cells of the first and second DRAM memory segments, wherein the controller is coupled to the pre-charge circuit to control the pre-charge circuit such that a pre-charge voltage is applied to the bit line pairs of the memory cells of the first DRAM memory segment during the first period of time and the pre-charge voltage is applied to the bit line pairs of the memory cells of the second DRAM memory segment during the second period of time, wherein a DRAM memory segment is defined by a number of word lines.

10. The device according to claim 9, wherein the controller controls the pre-charge circuit such that, when the ring counter reaches a DRAM memory segment boundary between the first and second DRAM memory segments, the pre-charge voltage of the bit line pairs of the first DRAM memory segment is switched off and the pre-charge voltage is switched on for the bit line pairs of the second DRAM memory segment.

11. The device according to claim 9, wherein the controller controls the pre-charge circuit such that the pre-charge voltage is switched on with a defined lead time before the period of time of refreshing the memory contents of the DRAM memory segment to be refreshed.

12. The device according to claim 9, wherein the device refreshes the memory contents of the memory cells in a self-refresh mode of a DRAM memory element on which the memory cells are arranged.

13. The device according to claim 9, wherein the device is at least partly attached to a DRAM memory element.

14. A device for refreshing memory contents of first memory cells and second memory cells, wherein the memory contents of the first memory cells are refreshed in a first period of time and the memory contents of the second memory cells are refreshed in a second period of time, the device comprising:

means for applying a pre-charge voltage to a bit line of the first memory cells during the first period of time and not during the second period of time and for applying the pre-charge voltage to the second memory cells during the second period of time and not during the first period of time.

15. The device according to claim 14, wherein the first memory cells and the second memory cells are implemented in a DRAM technology.

16. The device according to claim 14, wherein the device further comprises means for counting to address the first and second memory cells.

17. The device according to claim 16, wherein the first memory cells are in a first memory segment and the second memory cells are in a second memory segment and the means for applying the pre-charge voltage is controlled such that, when the means for counting reaches a segment boundary between the first and second memory segments, the pre-charge voltage of bit lines of the first memory segment is switched off and the pre-charge voltage is switched on for bit lines of the second memory segment.

18. The device according to claim 14, wherein the means for applying the pre-charge voltage is controlled such that the pre-charge voltage is switched on with a defined lead time before period of time of refreshing the memory contents of a memory segment to be refreshed.

19. The device according to claim 14, wherein the device refreshes the memory contents of the first and second memory cells in a self-refresh mode of a memory element on which the first and second memory cells are arranged.

20. A method for refreshing memory contents of first memory cells and second memory cells, wherein the memory contents of the first memory cells are refreshed in a first period of time and the memory contents of the second memory cells are refreshed in a second period of time, the method comprising:

applying a pre-charge voltage to a bit line of the first memory cells during the first period of time and not during the second period of time; and applying a pre-charge voltage to the second memory cells during the second period of time and not during the first period of time.

21. The method according to claim 20, wherein the first memory cells and the second memory cells are implemented in a DRAM technology.

22. The method according to claim 20, wherein the first and second memory cells are addressed by a ring counter.

23. The method according to claim 22, wherein the first memory cells are in a first memory segment and the second memory cells are in a second memory segment, and wherein, when the ring counter reaches a segment boundary between the first and second memory segments, the pre-charge voltage of bit lines of the first memory segment is switched off and the pre-charge voltage is switched on for bit lines of the second memory segment.

24. The method according to claim 20, wherein the pre-charge voltage is switched on with a defined lead time before a period of time of refreshing the memory contents of a memory segment to be refreshed.

25. The method according to claim 24, wherein the lead time is basically dependent on a bit line capacitance and on a transistor channel resistance in an on-state of a supply transistor for the pre-charge voltage.

26. The method according to claim 20, wherein the memory contents of the first and second memory cells are refreshed in a self-refresh mode of a memory element on which the first and second memory cells are arranged.

27. A controller for use in refreshing memory contents of first memory cells and second memory cells, wherein the memory contents of the first memory cells are refreshed in a first period of time and the memory contents of the second memory cells are refreshed in a second period of time, wherein the controller is configured to cause a pre-charge voltage to be applied to a bit line of the first memory cells during the first period of time and not during the second period of time; and to cause a pre-charge voltage to be applied to a bitline of the second memory cells during the second period of time and not during the first period of time.

* * * * *